(12) United States Patent
Tai et al.

(10) Patent No.: US 7,448,016 B2
(45) Date of Patent: Nov. 4, 2008

(54) PAD LAYOUTS OF A PRINTED CIRCUIT BOARD

(75) Inventors: Chan-Fei Tai, Tu-Cheng (TW); Ya-Ling Huang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 175 days.

(21) Appl. No.: 11/472,975

(22) Filed: Jun. 21, 2006

(65) Prior Publication Data

US 2006/0294489 A1    Dec. 28, 2006

(30) Foreign Application Priority Data

Jun. 28, 2005    (CN) .................... 2005 1 0035616

(51) Int. Cl.
*G06F 17/50*    (2006.01)
*H05K 1/00*    (2006.01)
*H01R 12/00*    (2006.01)

(52) U.S. Cl. .......................................... 716/15; 439/68
(58) Field of Classification Search ............... 716/15; 439/68; 174/35, 354
See application file for complete search history.

(56) References Cited

U.S. PATENT DOCUMENTS

| | | | | |
|---|---|---|---|---|
| 4,460,237 A | * | 7/1984 | Brown et al. ................... | 439/71 |
| 5,092,774 A | * | 3/1992 | Milan ............................ | 439/66 |
| 5,349,500 A | * | 9/1994 | Casson et al. ................. | 361/749 |
| 5,459,642 A | * | 10/1995 | Stoddard ...................... | 361/774 |
| 5,615,477 A | * | 4/1997 | Sweitzer ....................... | 29/840 |
| 5,663,529 A | * | 9/1997 | McMillan et al. ............ | 174/252 |
| 5,683,788 A | * | 11/1997 | Dugan et al. ................. | 428/209 |
| 5,702,256 A | * | 12/1997 | Severn ......................... | 439/71 |
| 5,719,749 A | * | 2/1998 | Stopperan .................... | 361/769 |
| 5,834,705 A | * | 11/1998 | Jonaidi ........................ | 174/261 |
| 6,115,262 A | | 9/2000 | Brunner et al. | |
| 6,162,064 A | * | 12/2000 | Faragi et al. ................... | 439/66 |
| 6,377,466 B1 | * | 4/2002 | Chen et al. ................... | 361/767 |
| 6,407,566 B1 | * | 6/2002 | Brunelle et al. .............. | 324/758 |
| 6,612,876 B2 | * | 9/2003 | Hyland ........................ | 439/676 |
| 6,899,550 B2 | * | 5/2005 | Perugini et al. ............... | 439/74 |

(Continued)

FOREIGN PATENT DOCUMENTS

GB    2306678 A  *  5/1997

*Primary Examiner*—Phallaka Kik
(74) *Attorney, Agent, or Firm*—Morris, Martin & Martin LLP; Tim Tingkang Xia, Esq.

(57) ABSTRACT

A pad layout of a printed circuit board includes a first and a second pad symmetrically arranged on the PCB for cooperatively receiving either a first surface mounted component (SMC) or a second surface mounted component (SMC). Each of the SMCs includes a first footprint and a second footprint. The first pad has a polygonal shape corresponding to a minimum sized shape that accommodates both a shape of the first footprint of the first SMC and a shape of the first footprint of the second SMC. The second pad has a polygonal shape corresponding to a minimum sized shape that accommodates both a shape of the second footprint of the first SMC and a shape of the second footprint of the second SMC.

7 Claims, 3 Drawing Sheets

U.S. PATENT DOCUMENTS

| | | | |
|---|---|---|---|
| 7,021,945 B2 * | 4/2006 | Perugini et al. | 439/74 |
| 7,284,221 B2 * | 10/2007 | Winings et al. | 716/11 |
| 2003/0214030 A1 * | 11/2003 | Bodas | 257/734 |
| 2004/0166704 A1 * | 8/2004 | Perugini et al. | 439/74 |
| 2006/0240688 A1 * | 10/2006 | Perugini et al. | 439/74 |

* cited by examiner

PAD LAYOUTS OF A PRINTED CIRCUIT BOARD

BACKGROUND

1. Technical Field

Related subject matter is disclosed in a co-pending U.S. patent application Ser. No. 11/490,400, filed on Jul. 26, 2006, which is assigned to the same assignee as this application.

The present invention relates to pad layouts of printed circuit boards (PCBs), and more particularly to a pad layout of a PCB which can readily and reliably receive surface mounted components (SMCs) thereon.

2. General Background

In general, SMCs, including resistors, capacitors, inductors and so on, are connected to a printed circuit board by pads. The pads are arranged on the printed circuit board in a matched relationship with footprints of the SMCs. The pads have different configurations due to varied configurations of the footprints of the SMCs, such as an ellipse, a circle, a square, a teardrop, and so on. Generally, however, the pad is only capable of receiving a certain SMC.

Referring to FIG. 2, a pad layout of a printed circuit board (PCB) using computer software (such as Protel) is for arranging SMCs, such as a 0805-type component 3, and a 0603-type component 5. A size of the 0805-type component 3 is larger than that of the 0603-type component 5. A pair of pads 8 each with an ellipse configuration is arranged on the PCB for receiving the 0805-type component 3. A pair of pads 6 each with an ellipse configuration is arranged on the PCB for receiving the 0603-type component 5. A lined frame 2 of the pads 8 is bigger than a lined frame 1 of the pads 6. A width W1 of the 0805-type component 3 is greater than a width W2 of the 0603-type component 5. A length of the 0805-type component 3 is L1. An outer distance L3 between the pads 8 is equal to an outer distance between footprints of the 0603-type component 3. An inner distance L5 between the pads 8 is equal to an inner distance between footprints of the 0805-type component 3. An inner distance L2 between the pads 6 is equal to an inner distance between footprints of the 0603-type component 5. Wherein L3>L5>L2, and W1>W2. The configuration of footprints of the 0803-type component 3 and the 0603-type component 5 are different. Therefore, each of these different SMCs require a different corresponding pad. The 0805-type component 3 and the 0603-type component 5 each have a pair of footprints corresponding to the pads 8 and pads 6 respectively. However, space on the printed circuit board is limited. Too many pads will decrease available space for electronic components and traces on the PCB causing difficulties to a layout engineer when he tries to selectively arrange multiple components on the PCB. Warnings 4 generated by the layout program may be frequent during the layout process further affecting the layout engineer's work.

Referring to FIG. 3, showing another computer generated pad layout of a PCB, the PCB includes a pair of rectangular pads 7. Each of the pads 7 embraces configurations of the corresponding pads 8 and pads 6. An outer distance L33 between the pads 7 is equal to the distance L3 indicated in FIG. 2. An inner distance between the pads L23 is equal to the distance L2 indicated in FIG. 2. A width W13 of each of the pads 7 is equal to the width W1 indicated in the FIG.2. A length of each of the pads 32 can be concluded as (L33−L23)/2, that is, (L3−L2)/2. However, the surface area of the pads 7 is large, and during the soldering process smaller SMCs have a tendency to float on the melted solder. This causes an untidy appearance of the PCB and can lead to short-circuiting on the PCB. Besides, to include all configurations of the corresponding pads 8 and pads 6 in the pads 7 may also cost more.

What is needed is a pad layout on a PCB which can readily and reliably receive surface mounted components (SMCs) on the PCB.

SUMMARY

An exemplary pad layout of a printed circuit board includes a first and a second pad arranged on the PCB for cooperatively receiving either a first surface mounted component (SMC) or a second surface mounted component (SMC). Each of the SMCs includes a first footprint and a second footprint. The first pad has a polygonal shape corresponding to a minimum sized shape that accommodates both a shape of the first footprint of the first SMC and a shape of the first footprint of the second SMC. The second pad has a polygonal shape corresponding to a minimum sized shape that accommodates both a shape of the second footprint of the first SMC and a shape of the second footprint of the second SMC.

Other advantages and novel features will become more apparent from the following detailed description when taken in conjunction with the accompanying drawings, in which:

DETAILED DESCRIPTION OF THE EMBODIMENTS

Figure 1:
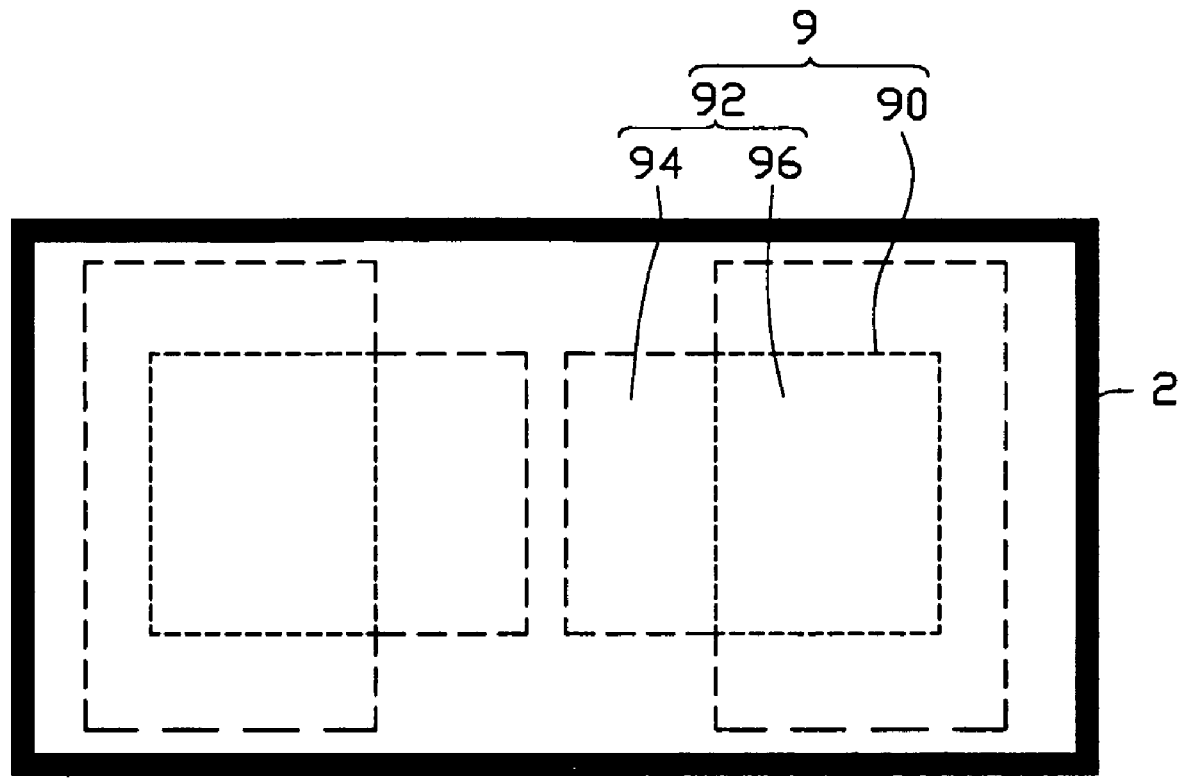
FIG. 1 is a plan view of a computer generated pad layout of a PCB in accordance with a preferred embodiment of the present invention.
Figure 2:
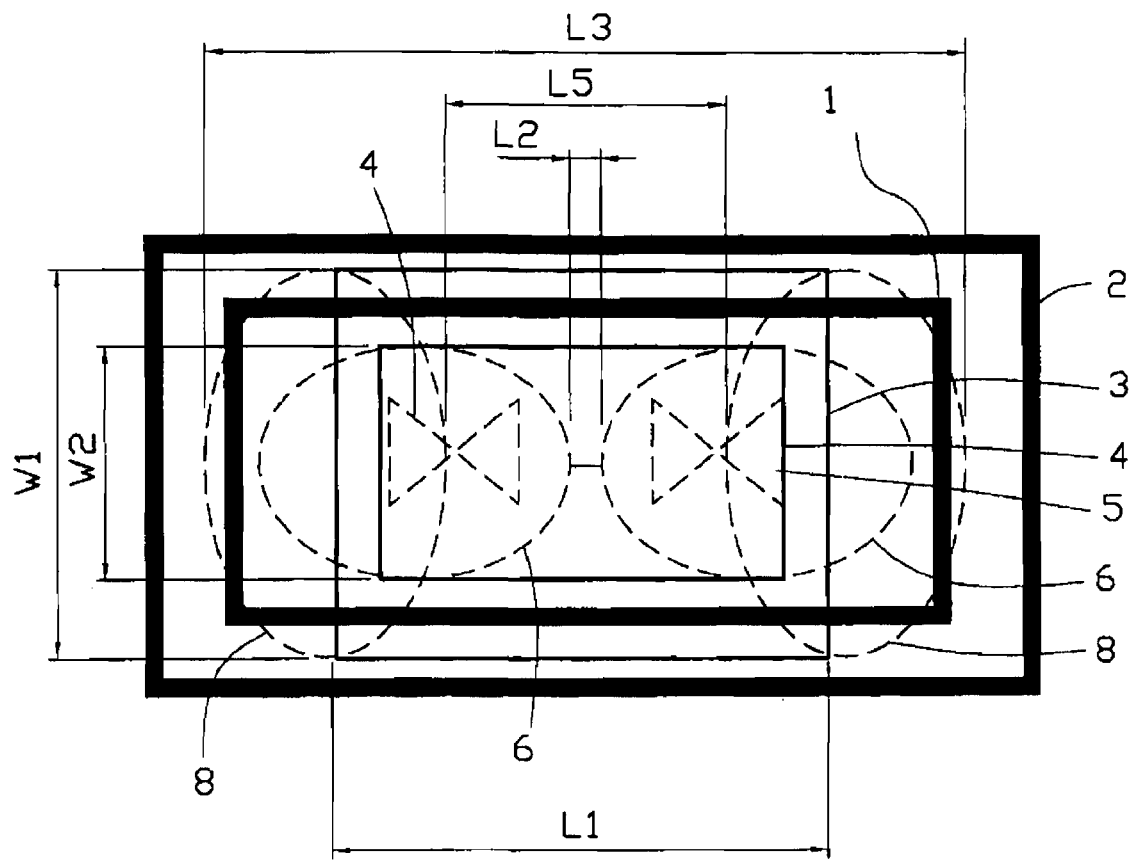
FIGS. 2 and 3 are plan views of conventional computer generated pad layouts of PCBs.
Figure 3:
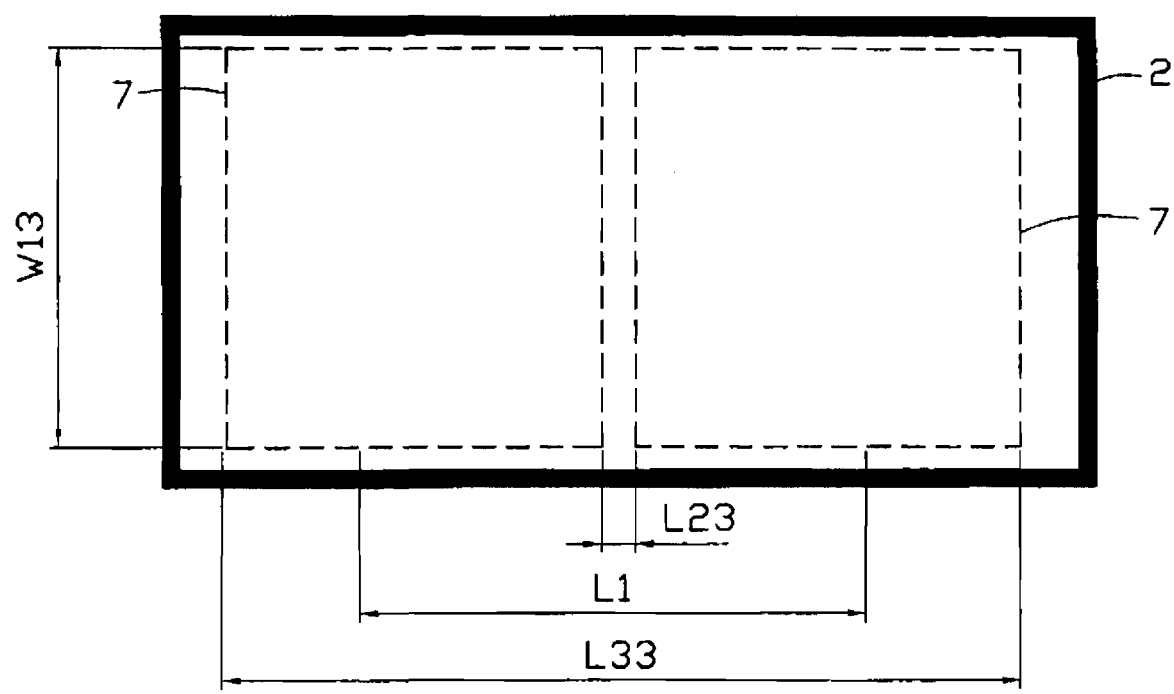

Referring to FIG. 1, a computer generated pad layout for a printed circuit board (PCB) according to a preferred embodiment of the present invention includes a pair of pads 9 for selectively receiving one of surface mounted components (SMCs) thereon. Referring also to FIG. 1, in the preferred embodiment, the pads 9 are for selectively receiving a 0805-type component 3 and a 0603-type component 5 thereon. The pair of pads 9 is arranged on the PCB. Each of the pads 9 is generally T-shaped, corresponding to a minimum sized shape that accommodates both a shape of the footprint of the 0805-type component 3 and a shape of the footprint of the 0603-type component 5.

By use of above described shapes, the surface area of the pads are minimized thereby reducing incidents of floating of small sized components, and reducing cost by minimizing materials used in manufacturing the pads. Further, in the design layout process of a PCB, by using pads shaped as described, a layout engineer will have more flexibility in solving issues related to limited space by having the freedom to design layouts that utilize more imaginative arrangements less dependent on the imposed symmetry of bulky large pads.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A pad layout on a printed circuit board (PCB) comprising:

a plurality of pads arranged on the PCB for cooperatively receiving either a first surface mounted component (SMC) or a second surface mounted component (SMC), the first SMC and the second SMC having same numbers of footprints;

each of the pads for selectively attaching a footprint of the first SMC and a footprint of the second SMC thereon, and integrating a first portion for receiving the footprint of the first SMC, and a second portion for receiving the footprint of the second SMC, the first portion overlapped with the second portions, the first and second portion both entirely located within an area of the pad, so that each of the pads can selectively receive the footprints of the first and second SMCs; wherein each of the pads has a polygonal shape corresponding to a minimum sized shape that accommodates both a shape of the first footprint of the first SMC and a shape of the first footprint of the second SMC.

2. The pad layout as claimed in claim 1, wherein the polygonal shape of each of the pads is T-shaped.

3. The pad layout as claimed in claim 2, wherein the polygonal shape of each of the pads comprises a first rectangle and a second rectangle overlapped with the first rectangle, the first rectangle circumscribes the footprint of the first SMC, the second rectangle circumscribes the footprint of the second SMC.

4. The pad layout as claimed in claim 1, wherein the polygonal shape of each of the pads is rectangular, and configurations of the footprints of the first and second SMCs are ellipses.

5. A pad layout on a printed circuit board (PCB) comprising:

a plurality of pads arranged on the PCB for selectively receiving a first surface mounted component (SMC) and a second surface mounted component (SMC), each of the SMCs comprising same numbers of footprints; and each of the pads comprising a first portion for receiving a footprint of the first SMC, and a second portion for receiving a footprint of the second SMC, wherein the second portion is overlapped with the first portion, a configuration and size of the first portion are similar to the footprint of the first SMC, and a configuration and size of the second portion are similar to the footprint of the second SMC, each of the pads having a polygonal shape corresponding to a minimum size shape circumscribing the footprint of the first SMC and the footprint of the second SMC.

6. The pad layout as claimed in claim 5, wherein the polygonal shape of each of the pads is T-shaped.

7. The pad layout as claimed in claim 6, wherein the polygonal shape of the pad comprises a first rectangle and a second rectangle overlapped with the first rectangle, the first rectangle circumscribes the footprint of the first SMC, the second rectangle circumscribes the footprint of the second SMC.

* * * * *